United States Patent [19]

Gay

[11] Patent Number: 4,627,081
[45] Date of Patent: Dec. 2, 1986

[54] SHIFT REGISTER STAGE

[75] Inventor: Michael J. Gay, Vaud, Switzerland

[73] Assignee: Motorola, Inc., Schaumburg, Ill.

[21] Appl. No.: 682,410

[22] Filed: Dec. 17, 1984

[30] Foreign Application Priority Data

Dec. 16, 1983 [GB] United Kingdom ................ 8333662

[51] Int. Cl.$^4$ ............................................. G11C 27/00
[52] U.S. Cl. ........................................ 377/58; 377/68; 307/315
[58] Field of Search ............................ 377/57, 58, 68; 307/315

[56] References Cited

U.S. PATENT DOCUMENTS

| 3,471,711 | 10/1969 | Poschenrieder et al. | 377/57 |
| 3,641,360 | 2/1972 | Yao | 377/68 |
| 4,076,986 | 2/1978 | Croisier et al. | 377/68 |
| 4,138,666 | 2/1979 | Eichelberger et al. | 377/58 |

Primary Examiner—John S. Heyman
Attorney, Agent, or Firm—Vincent B. Ingrassia

[57] ABSTRACT

A shift register stage responsive to a clock signal having first and second phases, the stage having an input and an output node (206 and 228) and comprising: capacitive storage means (208); switch means (202, 210) connected between the capacitive storage means and the input node of the stage and having a control electrode; and amplifier means (230) connected between the capacitive storage means and the output node of the stage, the switch means being conductive and non-conductive respectively during the first and second phases of the clock signal so that the capacitive storage means is charged during the first phase of the clock signal to a voltage representative of the voltage at the input node of the stage, and the amplifier means being operative during at least the second phase of the clock signal so that the amplifier means produces at the output node of the stage a voltage representative of the voltage on the capacitive storage means, wherein the voltage applied to the control electrode of the switch means is offset during the first phase of the clock signal by a first offset value from the voltage on the capacitive storage means and is offset during the second phase of the clock signal by a second offset value from the voltage on the capacitive storage means such that any charge removed from the capacitive storage means due to capacitive coupling effects between the capacitive storage means and the control electrode is independent of the voltage on the capacitive storage means.

6 Claims, 4 Drawing Figures

SHIFT REGISTER STAGE

This invention relates to a shift register stage. Shift register stages, responsive to clock signals, are used generally in charge transfer circuits and find particular application in, inter alia, sampled data filters.

A known shift register stage is shown in FIG. 1 of the accompanying drawings. The known shift register stage includes a storage capacitor 2. One electrode of the capacitor 2 is connected to a datum potential $V_o$ and the other electrode is connected to the collector of a switching transistor 4. The emitter of the transistor 4 is connected to the input terminal 6 of the stage. The base of the transistor 4 is connected to a current source 8 and to the collector of a switching transistor 10. The emitter of the transistor 10 is connected via a resistor 12 to the potential $V_o$. The collector of the transistor 4 is also connected to the base of a buffer amplifier transistor 14. The emitter of the transistor 14 is connected to the output terminal 16 of the stage and to a current source 18.

In use of the known shift register stage of FIG. 1 a clock signal is applied to the base of transistor 10. When the clock signal is high transistor 10 absorbs the whole of the current supplied by the current source 8 and prevents the transistor 4 from conducting; during this time the output signal is maintained by the charge stored on the capacitor 2. When the clock signal is low the transistor 10 absorbs less current from the current source 8 and so some of this current is supplied to the transistor 4 and renders it conductive; during this time the capacitor 2 is charged to a voltage substantially equal to the voltage at the input terminal 6. It will be understood that circuit values must be chosen so as to allow satisfactory operation in a desired application, e.g. the currents chosen must permit full charging of the capacitor 2 in the time available.

However, even with these routine design considerations satisified, the charge transfer efficiency of the shift register stage is still impaired by capacitive coupling effects between the base of the transistor 4 and the capacitor 2.

It is an object of this invention to provide a shift register stage wherein the above disadvantage may be overcome or at least alleviated.

In accordance with the invention a shift register stage responsive to a clock signal having first and second phases and having an input node and an output node comprises:
capacitive storage means;
switch means connected between the capacitive storage means and the input node of the stage and having a control electrode; and
amplifier means connected between the capacitive storage means and the output node of the stage,
the switch means being conductive and non-conductive respectively during the first and second phases of the clock signal so that the capacitive storage means is charged during the first phase of the clock signal to a voltage representative of the voltage at the input node of the stage, and the amplifier means being operative during at least the second phase of the clock signal so that the amplifier means produces at the output node of the stage a voltage representative of the voltage on the capacitive storage means,
wherein
the voltage applied to the control electrode of the switch means is arranged to be offset during the first phase of the clock signal by a first offset value from the voltage on the capacitive storage means and to be offset during the second phase of the clock signal by a second offset value from the voltage on the capacitive storage means such that any charge removed from the capacitive storage means due to capacitive coupling effects between the capacitive storage means and the control electrode is independent of the voltage on the capacitive storage means.

Two shift register stages in accordance with the invention will now be described, by way of example only, with reference to the accompanying drawings, in which.

Figure 1:
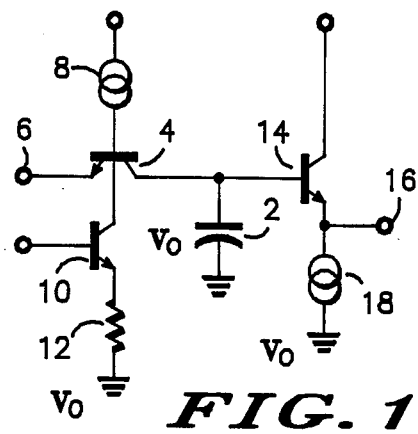
FIG. 1 shows a circuit diagram of the known shift register stage already described.
Figure 2:
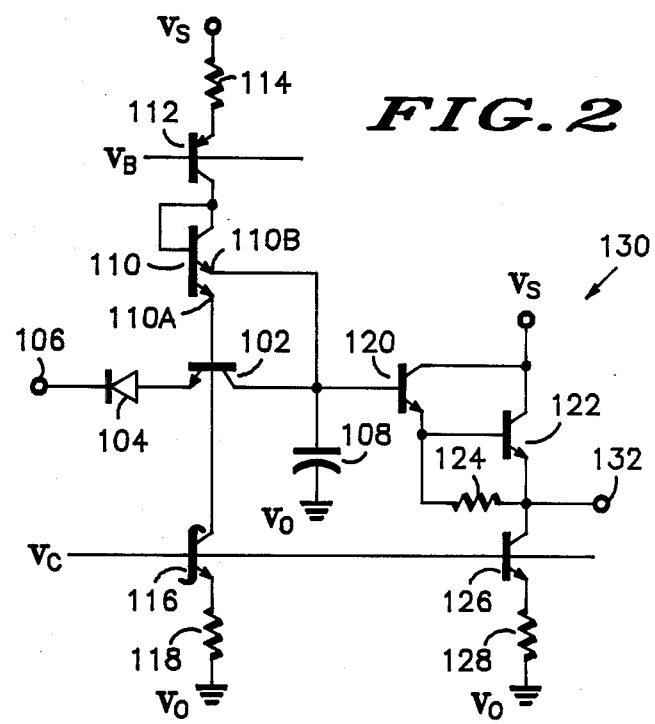
FIG. 2 shows a circuit diagram of a practical embodiment of the known circuit of FIG. 1.

Referring to FIG. 2, a practical embodiment of the known shift register stage of FIG. 1 already described includes a transistor switch 102 having collector, base and emitter electrodes. The emitter electrode of the transistor 102 is connected, via a diode 104, to an input terminal 106 of the stage. The collector electrode of the transistor 102 is connected to one electrode of a charge storage capacitor 108, the other electrode of which is connected to a datum potential $V_o$.

The base electrode of the transistor 102 is connected to one emitter electrode 110a of a double-emitter transistor 110. The other emitter electrode 110b of the transistor 110 is connected to the collector electrode of the transistor 102. The base and collector electrodes of the transistor 110 are connected to a biassing arrangement consisting of a transistor 112 and a resistor 114 connected to a source of potential $V_S$. The base electrode of the transistor 102 is also connected to the collector electrode of a Schottky clamped transistor 116, whose emitter electrode is connected through a resistor 118 to the datum potential $V_o$.

The collector electrode of the transistor 102 and the one electrode of the capacitor 108 are connected to the base electrode of a transistor 120. The collector electrode of the transistor 120 is connected to the potential $V_S$. The emitter electrode of the transistor 120 is connected to the base electrode of a transistor 122 and via a resistor 124 to the emitter electrode of the transistor 122.

The collector electrode of the transistor 122 is connected to the potential $V_S$ and the emitter electrode of the transistor 122 is connected to the collector electrode of the transistor 126 whose emitter is connected thriugh a resistor 128 to the datum potential $V_o$, the transistors 120 and 122 thus forming a Darlington pair 130. The emitter electrode of the transistor 122 is also connected to an output terminal 132 of the shift register stage.

In use of the shift register stage of FIG. 2 a bias voltage $V_B$ is applied to the base electrode of the transistor 112 and an appropriate clock signal $V_C$ is applied to the base electrodes of the transistors 116 and 126.

The double emitter transistor 110 serves to "clamp" the transistor 102 to prevent transistor 102 from saturating when the clock signal is low.

The diode 104 serves to reduce the total offset between the input and the output signals of the stage nominally to zero.

The use of the Darlington pair 130 to amplify the voltage on the capacitor 108 avoids discharging of the capacitor 108 during the period that transistor 102 is non-conductive which would occur if a single transistor amplifier were instead used.

However, the circuit of FIG. 2 is still subject to a capacitive coupling effect between the capacitor 108 and the base electrode of transistor 102, which effect impairs the performance of the stage as explained below:

When transistor 102 is conductive capacitor 108 is charged to the output voltage of the previous stage, plus two base-emitter voltage drops. Since the output voltage of the stage is two base-emitter voltage drops below the capacitor voltage, it will be appreciated that the capacitor is charged to a voltage substantially equal to that appearing on the capacitor of the previous stage, as desired. In this state the voltage established at the base of transistor 102 is substantially equal to that at its collector. There is thus practically no charge stored in the collector base capacitance of transistor 102. Once the capacitor 108 is fully charged a constant current (determined by the biassing conditions) flows in the emitter 110b of transistor 110 which is connected to the capacitor 108. The charge stored in the corresponding base-emitter junction is thus independent of the voltage to which the capacitor 108 is charged, i.e. independent of the transferred signal level.

However, when the clock signal goes high the voltage on the base of transistor 102 will be pulled down to a fixed voltage determined by the clock level due to the Schottky clamping of transistor 116. The voltage on the base of transistor 110 will be pulled down to a level one base-emitter drop above the voltage on the base of transistor 102.

In this state the collector-base capacitance of transistor 102 and the emitter-base depletion layer capacitance of emitter 110b of transistor 110 will have become charged to the differences between the voltage established on capacitor 108 and the respective fixed voltages established at the transistor bases. The stored charges will thus depend directly on the voltage established on capacitor 108, i.e. on the signal level.

The difference in the charges stored in the two junctions will be drawn necessarily from the charge established on capacitor 108. Therefore, the voltage established on the capacitor 108 will be reduced accordingly on the positive clock transition. It will be understood that the reduction will be dependent on the initial value of the voltage on the capacitor 108 i.e. dependent on the transferred signal level. There will consequently be an attenuation of the voltage stored on the capacitor 108. In practice this attenuation is not easily reduced below several percent. This is at least an order of magnitude higher than can be tolerated in many applications.

Figure 3:
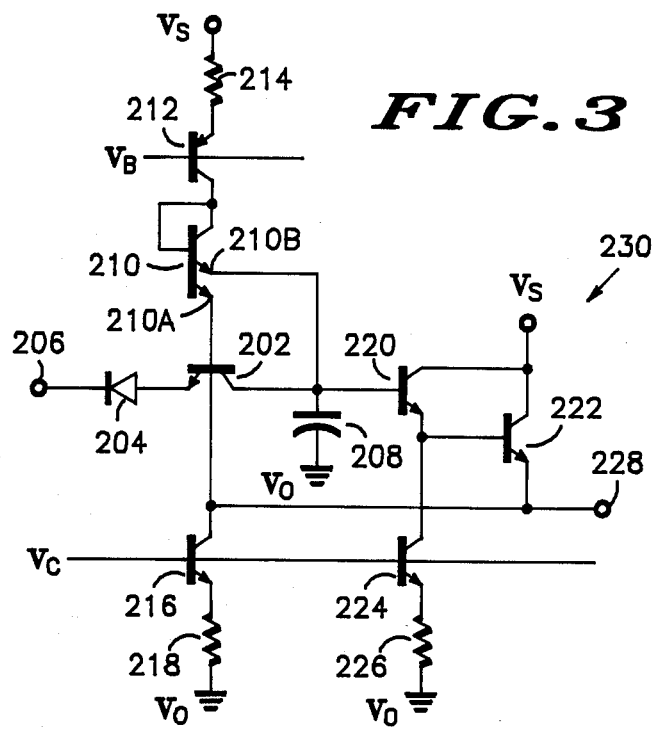
FIGS. 3 and 4 show circuit diagrams of first and second shift register stages in accordance with the present invention.
Figure 4:
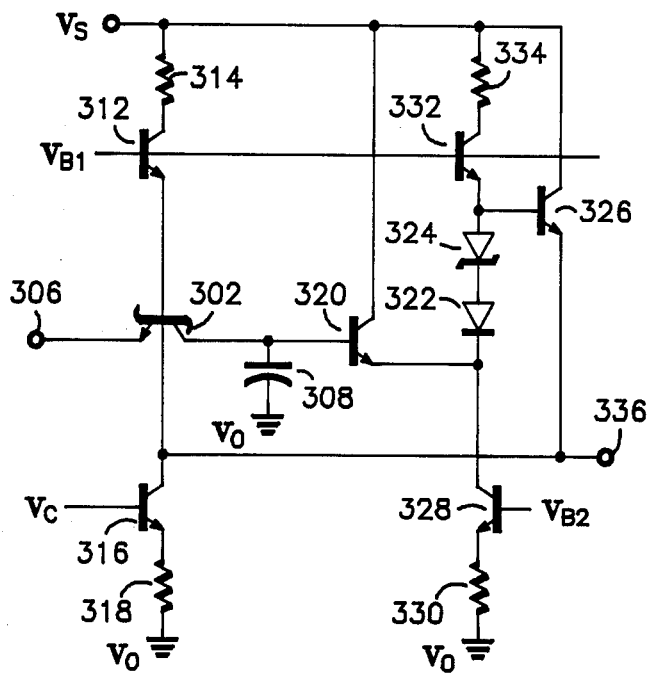

This deleterious capacitive coupling effect is overcome in the shift register stages shown in FIGS. 3 and 4 in accordance with the invention.

Referring to FIG. 3, the first shift register stage in accordance with the invention includes a transistor switch 202 having collector, base and emitter electrodes. The emitter electrode of the transistor 202 is connected, via a diode 204, to an input terminal 206 of the stage. The collector electrode of the transistor 202 is connected to one electrode of a charge storage capacitor 208, the other electrode of which is connected to the datum potential $V_o$.

The base electrode of the transistor 202 is connected to one emitter electrode 210a of a double-emitter transistor 210. The other emitter electrode 210b of the transistor 210 is connected to the collector electrode of the transistor 202. The base and collector electrodes of the transistor 210 are connected to a biassing arrangement consisting of a transistor 212 and a resistor 214 connected to the potential $V_s$. The base electrode of the transistor 202 is also connected to the collector electrode of a transistor 216, whose emitter electrode is connected through a resistor 218 to the datum potential $V_o$.

The collector electrode of the transistor 202 and the one electrode of the capacitor 208 are connected to the base electrode of a transistor 220. The collector electrode of the transistor 220 is connected to the potential $V_s$. The emitter electrode of the transistor 220 is connected to the base electrode of a transistor 222 and to the collector electrode of a transistor 224, whose emitter electrode is connected through a resistor 226 to the datum potential $V_o$.

The collector electrode of the transistor 222 is connected to the potential $V_s$ and the emitter electrode of the transistor 222 is connected to an output terminal 228 of the shift register stage, the transistors 220 and 222 thus forming a Darlington pair 230. The output terminal 228 is also connected to the base electrode of the transistor 202.

In use of the shift register stage of FIG. 3 a bias voltage $V_B$ is applied to the base electrode of the transistor 212 and an appropriate clock signal $V_c$ is applied to the base electrodes of the transistors 216 and 224.

The double emitter transistor 210 serves to "clamp" the transistor 202 to prevent transistor 202 from saturating when the clock signal is low and the diode 204 serves to reduce the total offset between the input and the output signals of the stage nominally to zero.

The input transistor 220 of the Darlington pair 230 is biased by a current source 224, 226. This avoids the following problem which occurs with the transistor biased by a resistor connected between its base and emitter electrodes, as in FIG. 2: with the above-mentioned resistor biasing arrangement the transistor may transitionally cease conduction when the switching transistor of the succeeding stage is rendered conductive, dependent on the initial states of charge of the capacitors in the two stages; the consequent perturbation of the base current drawn by the amplifying transistor may be shown to correspond to a reduction in signal transfer ratio.

When the clock signal $V_c$ is low, capacitor 208 is charged to substantially the same voltage as that established on the capacitor of the previous stage in the same way as already described with respect to FIG. 2. However, the Darlington amplifier 230 of FIG. 3, unlike the Darlington amplifier 130 of FIG. 2, is non-conducting during this phase. Since the output signal is not used during this phase of the clock signal, this is no inconvenience and results in a saving in average current consumption.

The harmful capacitive coupling effect described above in relation to FIG. 2 is overcome in the circuit of FIG. 3 by connecting the emitter electrode of transistor 222 to the base electrode of transistor 202. The effect of this is that when the clock signal goes high the voltage on the base of transistor 202 is pulled to a level two base-emitter drops below the voltage established on capacitor 208 and the base of transistor 210 is pulled to a level one base-emitter drop below this voltage. The capacitance of the collector-base junction of transistor 202 is thus charged to two base-emitter voltages in this state and the depletion layer capacitance of the junction of emitter 210b and the base of transistor 210 is charged to one base-emitter voltage. The charges stored in these two junctions (which, in the same way as explained in relation to FIG. 2, are drawn from the charge stored on capacitor 208) are now independent of the voltage established on the capacitor, i.e. independent of the transferred signal level. Thus, although a change in the quiescent voltage established on the capacitor 208 occurs, there is no attenuation of the signal component.

It will be understood that the circuit of FIG. 3 produces an incidental advantage in that when the clock signal is high the excess current drawn by transistor 216, above that supplied by current source 212, 214, provides the bias current for the Darlington amplifier 230 which is required to be operational in this phase. Thus transistor 216 need not be clamped to avoid saturation and the excess current drawn is not wasted.

Referring to FIG. 4, the second shift register stage in accordance with the invention includes Schottky clamped transistor switch 302 having collector, base and emitter electrodes. The emitter electrode of the transistor 302 is connected to an input terminal 306 of the stage. The collector electrode of the transistor 302 is connected to one electrode of a charge storage capacitor 308, the other electrode of which is connected to the datum potential $V_o$.

The base electrode of the transistor 302 is connected to a biassing arrangement consisting of a transistor 312 and a resistor 314 connected to a source of potential $V_s$. The base electrode of the transistor 302 is also connected to the collector electrode of a transistor 316, whose emitter electrode is connected through a resistor 318 to the datum potential $V_o$.

The base electrode of the transistor 302 is connected to a biassing arrangement consisting of a transistor 312 and a resistor 314 connected to a source of potential $V_s$. The base electrode of the transistor 302 is also connected to the collector electrode of a transistor 316, whose emitter electrode is connected through a resistor 318 to the datum potential $V_o$.

The collector electrode of the transistor 302 and the one electrode of the capacitor 308 are connected to the base electrode of a transistor 320. The collector electrode of the transistor 320 is connected to the potential $V_s$. The emitter electrode of the transistor 320 is connected via a series connected diode 322 and Schottky diode 324 to the base electrode of a transistor 326. The emitter electrode of the transistor 320 is also connected to the collector electrode of a transistor 328 whose emitter electrode is connected through a resistor 330 to the datum potential $V_o$.

The base electrode of the transistor 326 is also connected to a biassing arrangement consisting of a transistor 332 and a resistor 334 connected to the potential $V_s$. The collector electrode of the transistor 326 is connected to the potential $V_s$. The emitter electrode of the transistor 326 is connected to an output terminal 336 of the stage.

The output terminal 336 is also connected to the base electrode of the transistor 302.

In use of the shift register stage of FIG. 4 a bias voltage $V_{B1}$ is applied to the base electrodes of the transistors 312 and 332, and a bias voltage $V_{B2}$ is applied to the base electrode of the transistor 328. An appropriate clock signal $V_c$ is applied to the base electrode of the transistor 316.

The Schottky clamping of the transistor 302 prevents the transistor from saturating when the clock signal is low and the diode 322 and Schottky diode 324 serve to reduce the total offset between the input and the output signals of the stage nominally to zero.

It will be appreciated that the circuit of FIG. 4 overcomes the harmful capacitive coupling effect described above in relation to FIG. 2 by connecting the emitter electrode of transistor 326 to the base electrode of transistor 302 in the same way as described above with respect to the circuit of FIG. 3.

I claim:

1. A shift register stage responsive to a clock signal having first and second phases, the stage having an input and an output node and comprising:

capacitive storage means;

switch means connected between the capacitive storage means and the input node of the stage and having a control electrode; and amplifier means connected between the capacitive storage means and the output node of the stage, the switch means being conductive and non-conductive respectively during the first and second phases of the clock signal so that the capacitive storage means is charged during the first phase of the clock signal to a voltage representative of the voltage at the input node of the stage, and the amplifier means being operative during at least the second phase of the clock signal so that the amplifier means produces at the output node of the stage a voltage representative of the voltage on the capacitive storage means, wherein means providing the voltage applied to the control electrode of the switch means to be offset during the first phase of the clock signal by a first offset value from the voltage on the capacitive storage means and to be offset during the second phase of the clock signal by a second offset value from the voltage on the capacitive storage means such that any charge removed from the capacitive storage means due to capacitive coupling effects between the capacitive storage means and the control electrode is independent of the voltage on the capacitive storage means.

2. A shift register stage according to claim 1 wherein the voltage applied to the control electrode of the switch means is offset at least during the second phase of the clock signal by coupling means connected between the control electrode and the output node of the stage.

3. A shift register stage according to claim 2 wherein the output node of the stage is connected to the control electrode and the amplifier means is responsive to the clock signal such that the amplifier means is operative during the second phase of the clock signal and the amplifier means when operative provides an output voltage offset from the voltage on the capacitive storage means and when not operative provides a high impedance at the output node of the stage.

4. A shift register stage according to claim 1 wherein the switch means comprises:

a first transistor having an emitter electrode and a collector electrode coupled respectively to the input node of the stage and to the capacitive storage means and having a base electrode constituting the control electrode; and a second transistor having a base electrode and collector electrode coupled to a source of datum potential and having a first emitter connected to the capacitive storage means and a second emitter connected to the control electrode.

5. A shift register stage according to claim 1 wherein the switch means comprises a Schottky clamped transistor.

6. A shift register stage responsive to a clock signal having first and second phases, the stage having an input and an output node and comprising:
   capacitive storage means;
   switch means connected between the capacitive storage means and the input node of the stage and having a control electrode; and
   a Darlington transistor amplifier comprising input and output transistors, said input transistor having a base electrode coupled to said capacitive storage means, a collector electrode coupled to a source of reference potential and an emitter electrode connected to a source of current, and said output transistor having a base electrode coupled to the emitter electrode of said input transistor, a collector electrode coupled to said source of reference potential, and an emitter electrode coupled to said output node;
   the switch means being conductive and nonconductive respectively during the first and second phases of the clock signal so that the capacitive storage means is charged during the first phase of the clock signal to a voltage representative of the voltage at the input node of the stage, and the amplifier being operative during at least the second phase of the clock signal so that the amplifier produces at the output node of the stage a voltage representative of the voltage on the capacitive storage means, wherein
   the voltage applied to the control electrode of the switch means is arranged to be offset during the first phase of the clock signal by a first offset value from the voltage on the capacitive storage means and to be offset during the second phase of the clock signal by a second offset value from the voltage on the capacitive storage means such that any charge removed from the capacitive storage means due to capacitive coupling effects between the capacitive storage means and the control electrode is independent of the voltage on the capacitive storage means.

* * * * *